United States Patent
Paganelli et al.

(10) Patent No.: US 9,389,280 B2
(45) Date of Patent: Jul. 12, 2016

(54) DEVICE FOR MEASURING VOLTAGE IN A FUEL CELL WITH AN IMPROVED ARRANGEMENT OF MEASUREMENT MODULES

(71) Applicants: COMPAGNIE GENERALE DES ETABLISSEMENTS MICHELIN, Clermont-Ferrand (FR); Michelin Recherche et Technique S.A., Granges-Paccot (CH)

(72) Inventors: Gino Paganelli, Clermont-Ferrand (FR); David Olsommer, Clermont-Ferrand (FR)

(73) Assignees: COMPAGNIE GENERALE DES ETABLISSEMENTS MICHELIN, Clermont-Ferrand (FR); MICHELIN RECHERCHE ET TECHNIQUE S.A., Granges-Paccot (CH)

( * ) Notice: Subject to any disclaimer, the term of this patent is extended or adjusted under 35 U.S.C. 154(b) by 176 days.

(21) Appl. No.: 14/354,658

(22) PCT Filed: Nov. 2, 2012

(86) PCT No.: PCT/EP2012/071738
§ 371 (c)(1),
(2) Date: Apr. 28, 2014

(87) PCT Pub. No.: WO2013/064645
PCT Pub. Date: May 10, 2013

(65) Prior Publication Data
US 2014/0300367 A1 Oct. 9, 2014

(30) Foreign Application Priority Data
Nov. 4, 2011 (FR) ...................... 11 59986

(51) Int. Cl.
*G01N 27/416* (2006.01)
*G01R 31/36* (2006.01)
*H01M 8/04* (2016.01)

(52) U.S. Cl.
CPC ....... *G01R 31/3658* (2013.01); *H01M 8/04552* (2013.01); *G01R 31/362* (2013.01); *Y02E 60/50* (2013.01)

(58) Field of Classification Search
CPC .................... G01R 31/3658; G01R 19/16542; G01R 31/3648; H02J 7/0021; Y02E 60/12
USPC ......................................................... 324/434
See application file for complete search history.

(56) References Cited

U.S. PATENT DOCUMENTS

| | | | |
|---|---|---|---|
| 2003/0048091 A1 | 3/2003 | Sato et al. | 320/101 |
| 2005/0186456 A1 | 8/2005 | Andreas-Schott et al. | 429/23 |
| 2007/0202371 A1* | 8/2007 | Takeda | G01R 31/3658 429/432 |
| 2007/0231641 A1 | 10/2007 | Skala et al. | 429/23 |
| 2011/0217612 A1 | 9/2011 | Zawisa et al. | 429/432 |
| 2012/0071041 A1* | 3/2012 | Dolhagaray | H05K 7/1432 439/890 |
| 2012/0237843 A1 | 9/2012 | Paganelli | 429/429 |
| 2013/0043861 A1 | 2/2013 | Ishikawa | 324/72 |

FOREIGN PATENT DOCUMENTS

| | | |
|---|---|---|
| EP | 1 411 569 A2 | 4/2004 |
| EP | 2 211 412 A1 | 7/2010 |
| JP | 2005-141936 A | 6/2005 |
| WO | WO 2008/108979 A1 | 9/2008 |
| WO | WO 2011/136111 A1 | 11/2011 |

* cited by examiner

*Primary Examiner* — Arun Williams
(74) *Attorney, Agent, or Firm* — Fitzpatrick, Cella, Harper & Scinto

(57) ABSTRACT

A device for measuring voltages of N cells in a fuel cell includes plural voltage measurement modules and a communication bus connecting in series the plural measurement devices to a computer. The N cells are separated by bipolar plates. Each module can measure M voltages on a group of adjoining cells of the fuel cell, with M being a natural number, and with M≤N/2. A group of cells measured by a first module is adjacent to group of cells measured by a second module. Each module includes a mechanism for fixing the module onto the fuel cell, a voltage measurement device, a connector for connecting bipolar plates of the module to the voltage measurement device, and a connector for connecting the voltage measurement device to the communication bus. A last bipolar plate connected to the first module also is connected to the second module.

10 Claims, 3 Drawing Sheets

DEVICE FOR MEASURING VOLTAGE IN A FUEL CELL WITH AN IMPROVED ARRANGEMENT OF MEASUREMENT MODULES

FIELD OF THE INVENTION

The present invention relates to the field of fuel cells and notably systems for monitoring such cells. More particularly, it relates to devices for measuring voltages in fuel cells.

Fuel cells are showing growing success in a number of applications. They are notably of interest in the automotive industry as part of the development of electric vehicles, since they form clean electricity generators which, combined with a fuel tank, provide an energy density greater than battery type electrochemical accumulators, and exhibit good efficiency.

In a fuel cell, electricity is produced by a double chemical reaction: the oxidation of a fuel, for example hydrogen, on an electrode, coupled with the reduction of an oxidant, for example oxygen, on another electrode. This double chemical reaction takes place within a cell generally including an anode and a cathode between which a membrane is arranged, forming a Membrane Electrode Assembly (MEA). Various types of membranes can be used, and ion exchange membranes or solid oxide membranes, for example, are known.

PRIOR ART

Depending on the applications, it can turn out to be necessary to use a fuel cell exhibiting a more or less large stack of cells, in order to provide the desired quantity of electrical power. For example, in the field of electric vehicles, it is not rare to encounter stacks having more than a hundred stacked cells. A stack is therefore made up of a group of MEAs separated by bipolar plates. These plates include an anodic side and a cathodic side, which provide for feeding the adjacent cells of the stack with gas. However, the first and last plates of the stack are not bipolar, and exhibit only one polarization. Due to a misuse of language, a stack is generally referred to as a fuel cell, and each MEA is referred to as a cell or electrochemical cell. This vocabulary will be used hereafter in this application.

In a fuel cell used, for example, in an electric car, any anomaly that can lead to a malfunctioning or to dangerous behaviour of the fuel cell must be detected. To this end, it is useful to obtain individual items of information about each cell, notably concerning the voltage generated.

From the patent application US 2011/0217612, there is known a measurement device including several modules installed directly on a fuel cell. Each module is intended for the measurement of a group of cells, and the various modules communicate with each other via optical signals. This device additionally includes an aggregating component located at the end of the fuel cell, intended to receive the measurements performed by each module.

Such a device exhibits a number of drawbacks, due to its configuration. In particular, the modules are powered by the cells themselves, meaning that a loss of voltage on one or more cells leads to a loss of power for the modules, which are then no longer capable of carrying out the measurements. This device thus appears to be inappropriate for the measurement of very low voltages, or even slightly negative voltages.

The present invention therefore aims to propose a device for remedying these drawbacks while providing a measurement solution that is simple to install and use, and that is reliable and economical.

BRIEF DESCRIPTION OF THE INVENTION

The invention thus relates to a device for measuring voltages of cells in a fuel cell containing N electrochemical cells separated by bipolar plates, where N is a natural number, the system comprising:
  at least two voltage measurement modules, each module being capable of measuring M voltages on a group of adjoining cells of the fuel cell, where M is a natural number less than or equal to N/2, the group of cells measured by the first module being adjacent to the group of cells measured by the second module,
  an electronic computer, and
  a wired communication bus connecting in series the at least two measurement devices to the computer,
each of the measurement modules comprising:
  mechanical means for fixing the module onto the fuel cell,
  electronic voltage measurement means,
  electrical connection means for connecting the bipolar plates to the at least one electronic voltage measurement means,
  means for connecting the electronic voltage measurement means to the communication bus,
and each module being shaped to cooperate with the adjacent module in such a way that the last bipolar plate connected to the first module is also connected to the second module.

As will be apparent in the drawings illustrating embodiments of the present invention, the modules have a shape exhibiting a staggering which is such that a bipolar plate located on the border of two adjacently-arranged modules, perpendicularly to the side faces of the modules, is connected to these two modules without resorting to the use of an additional electrical connection.

Furthermore, in a preferred way, the mechanical fixing means for fixing the module onto the fuel cell and the electrical connection means will be merged. Thus, in a particular embodiment, these means will include connectors, for example female connectors of the Faston® type, which provide for achieving both a mechanical and an electrical connection. These female connectors include two metal parts arranged to clasp metal lugs formed on the bipolar plates of the fuel cell, and enabling the connection to be achieved.

In a particular embodiment of the invention, each electronic voltage measurement means measures the voltages of two adjacent cells. Specifically, given how thin the electrochemical cells of a fuel cell are, it turns out that installing means for measuring the individual voltages of each cell is not very ergonomic. Furthermore, it was observed that the sensitivity of the measurement means was sufficient for a measurement performed across two cells to provide for the accounting of the state of each of the cells. Thus, in a particular embodiment, a module performs eight voltage measurements for a group of sixteen cells.

In a particular embodiment of the invention, the wired communication bus is a CAN® (Controller Area Network) type serial bus, exhibiting characteristics of robustness that are useful in the context of a device such as that of the present invention. In another particular embodiment, an I2C type bus is used.

Moreover, in another particular embodiment of the invention, the measurement device comprises at least one galvanic isolation device between the wired communication bus and the fuel cell. Such a device comprises, for example, an optocoupler. Specifically, the fuel cell is made up of cells connected in series; depending on its position on the fuel cell, each measurement module is therefore at a different potential with respect to the negative polarity of the fuel cell. It is therefore appropriate to implement a galvanic isolation between the measurement means and the common communication bus.

In another particular embodiment of the invention, each voltage measurement module includes an address, or coding, which is different from the other modules. Specifically, as explained later, this allows the electronic computer to address the requests through which measurements are demanded from the various modules.

The electronic computer is used to generate the measurements performed by the device. To this end, it communicates with the modules via the wired communication bus, and receives the results of the measurements via the same means. Hereafter in the application, this computer will be referred to as a controller, without however restricting the scope of the term to a specific type of component.

BRIEF DESCRIPTION OF THE DRAWINGS

Other objectives and advantages of the invention will become clear in the following description of a preferred but non-limiting embodiment, illustrated by the following drawings in which.

DESCRIPTION OF THE BEST EMBODIMENT OF THE INVENTION

Figure 1:
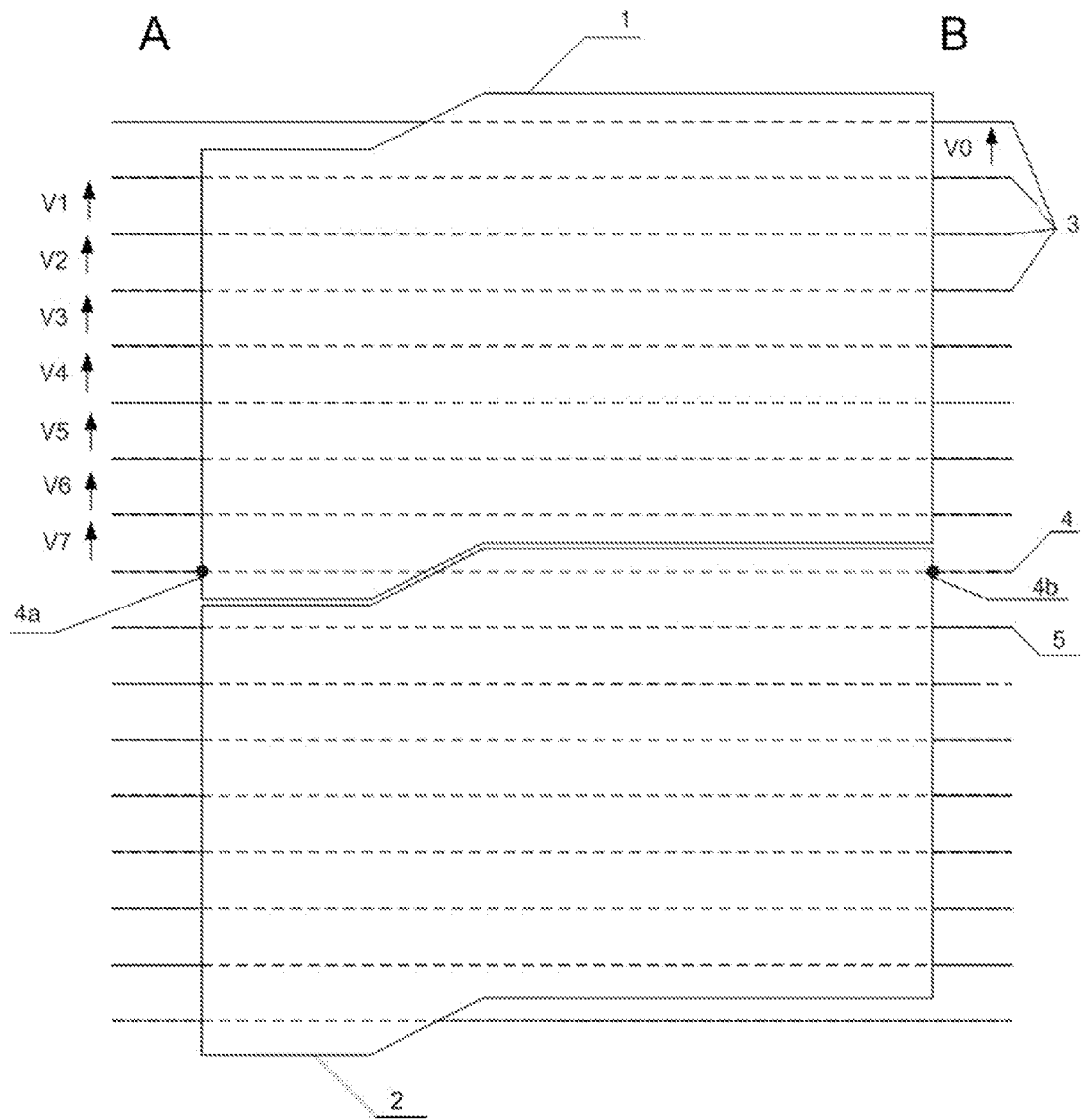
FIG. 1 schematically represents the installation of two measurement modules on a fuel cell.

FIG. 1 represents a device according to a particular embodiment of the invention. This device comprises a first voltage measurement module 1 and a second voltage measurement module 2, which are installed on a fuel cell. The fuel cell is represented in a view from above, and only the bipolar plates 3 separating the various MEAs of the stack are visible. In the drawing, only four plates bear the reference 3, but it is understood that each horizontal line bearing a voltage measurement represents a bipolar plate. It is to be noted that, in this particular example of the invention, the voltage measurements are not performed on each cell, but on groups of two adjoining cells. For the sake of simplification, only bipolar plates at the terminals of which voltage measurements are performed, are represented in FIG. 1, i.e. one plate out of two with respect to the complete stack.

The first module is used to perform eight voltage measurements V0 to V7, thus covering sixteen cells. To this end, the measurement module must be connected to at least nine bipolar plates, as shown in this drawing. In this particular example embodiment, the metal connections used to hold the module in position on the fuel cell also serve as electrical connections. As shown in this drawing, the measurement module is connected to each bipolar plate via two connections: one located on the lefthand side, in area A, the other located on the righthand side, in area B, with the exception of the first and last connected plates. This leads to a redundancy in the measurement of the voltages V1 to V7. However, this redundancy is also of mechanical nature and thus provides for ensuring good stability of the assembly.

Figure 4:
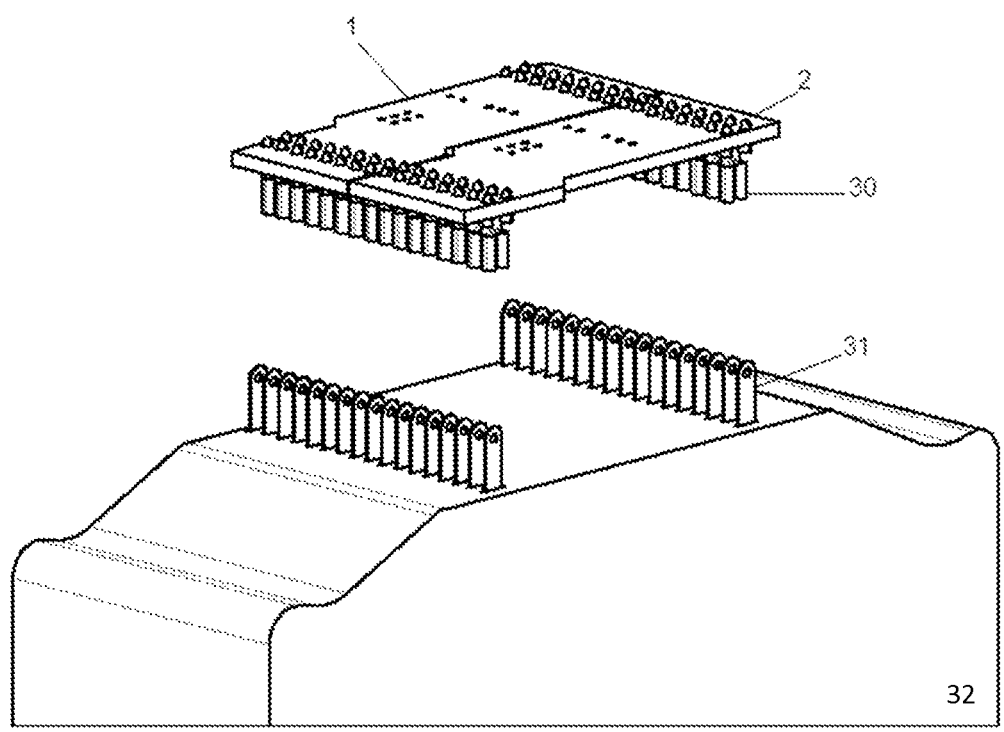
FIG. 4 represents an exploded view of an installation as shown in FIG. 1.

FIG. 4 shows an example embodiment of a measurement device including two modules 1 and 2, which is intended to be installed on a fuel cell 32. In this particular example, the connection means of the modules are metal connectors 30, of the Faston type. The bipolar plates are equipped with metal lugs 31, enabling the connections with connectors to be established. Advantageously, one bipolar plate includes two metal lugs.

Additionally, it is observed in FIG. 1 that the shape of the first and second modules 1 and 2 is such that the bipolar plate 4 is connected both to the first module, at the connection 4a, and to the second module, at the connection 4b. By virtue of this shape, the voltage between the plates 4 and 5 can be measured without resorting to any additional connection between the modules 1 and 2. Specifically, if the modules were of rectangular shape, the longest length of a module located parallel to the plates, the bipolar plate 4 would be connected only to a single module, for example the module 1. In that case, to measure the voltage between the plates 4 and 5, it would be necessary to set up a wired connection in order to transmit the potential of the plate 4 to the module 2 which would perform the measurement, or transmit the potential of the plate 5 to the module 1 which would perform the measurement in that case.

Such a device exhibits a number of advantages in terms of reliability, simplicity of installation and use and economy. Specifically, each module is intended to measure the voltages at the terminals of a small number of cells, for example sixteen. The spacing between the connections of the modules is given by the thickness of the cells. Now, depending on the construction of the fuel cell, and depending on the temperature and on the clamping pressure of the assembly, the thickness can vary, and, over the whole stack, can lead to a total variation preventing the installation of a measurement device of predetermined size. However, on an assembly of sixteen cells, the total variation never reaches such a value that a module according to an embodiment of the invention cannot be installed. Moreover, such a module is simple and economical in that the electrical and mechanical connections are achieved by a single component. Additionally, the particular shape of the modules avoids the installation of wired connections between the modules of the device, thus simplifying its installation and preventing any untimely disconnection at this level.

The operation of a module will now be described with reference to FIG. 2 which shows an example functional architecture of the module 1 used in a device according to the invention. For the sake of simplification, in this drawing only the inputs of the side A are represented.

The module 1 is connected to nine bipolar plates, thereby providing for proceeding with the measurement of eight voltages V0 to V7. These measurements are performed by eight operational amplifier circuits 10. These voltages are then transmitted to an analogue-to-digital converter 11. This converter is connected to a reference value 12 equal for example to 2.5 volts, providing for comparing the measurements transmitted by the circuits 10.

The analogue-to-digital converter 11 can convert only positive voltages. Now, it is desirable, in one embodiment of the invention, to be able to measure negative voltages also, which provide for detecting an inversion of a cell, notably due to an under-supply of hydrogen. To remedy this, the converter 11 is also connected to a device 13 which enables the application of an offset voltage on the measured voltages, before the conversion.

Once the conversion of a measurement is carried out, the result is transmitted to a data bus 14. This bus is, for example, a serial bus of the I2C (Inter Integrated Circuit) type, or of the CAN® type. This data bus 14 routes the data to a second data bus 15, which then routes the data to a main controller 20 (see FIG. 3). If the buses 14 and 15 are not of the same type, it is useful to provide a microcontroller 16 for converting the data to a format supported by the bus 15. Moreover, in order to prevent the high voltages present at the fuel cell from propagating onto the bus 15 and damaging some components, it is useful to have a galvanic isolation device 17, for example an optocoupler.

The whole of the module 1 is powered by the bus 15. To this end, a voltage-to-voltage converter 18 is installed in the module and connected to the main components. This converter also comprises, in a preferred embodiment, a galvanic isolation device to avoid the previously mentioned problem.

Figure 2:
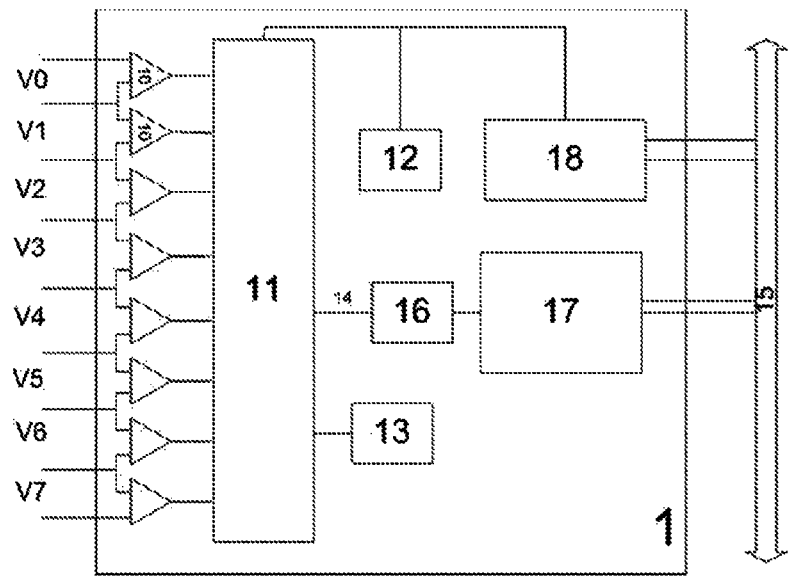
FIG. 2 represents a functional diagram of a module used as part of a device according to the invention.
Figure 3:
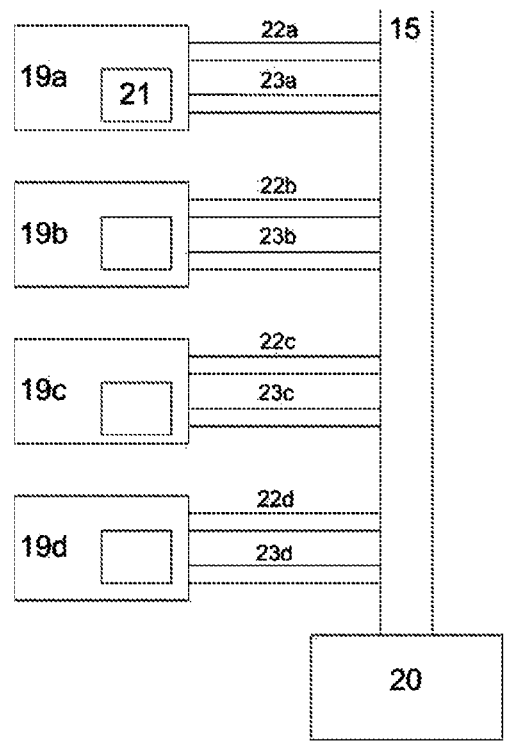
FIG. 3 represents a device according to the invention including four measurement modules.

A module as illustrated in FIG. 2 is intended to be used in a device, an example of which is shown in FIG. 3.

This device comprises four modules 19a, 19b, 19c and 19d. Each of the modules is connected to the bus 15 which connects them to the controller 20. The number of modules is given here by way of example and is not limiting. A four-module device, for the case in which an eight-input converter is used, provides for measuring thirty-two voltages. It can therefore be used on a fuel cell with sixty-four cells for the case in which the voltages of cells are measured per group of two cells. Each of the other modules has an address 21 making it possible to distinguish it. For example, this address is coded on three bits with three states and is physically registered on each module by the use of soldering points for making electrical links representing each of the bits.

The controller 20 is the component which manages the operation of the measurement device, and notably which orders the measurements. Specifically, voltage measurements are not transmitted constantly to the controller, but only upon request.

In the absence of a request, the modules draw from the bus 15, via the corresponding links 22a, 22b, 22c and 22d, only a hold current enabling them to receive the requests and to determine whether they are concerned. On the other hand, in the absence of a request, the converter 11 is not activated, therefore no conversion is carried out.

When a measurement is necessary, the controller 20 first sends a request on the bus, including the address of the module and the position of the cell for which it is desired to receive the voltage. On receiving the request, the addressed module leaves its standby state and draws a greater current from the bus 15.

It then proceeds with a reading of the value previously converted and stored at the converter 11, and then triggers a new conversion intended to be used during a later request. The read value is then transferred onto the bus 15 via the corresponding link from among the links 23a to 23d, and then communicated to the controller 20.

The controller 20 of the fuel cell is thus, depending on the measurements received, capable of determining that the voltages are not locked and that they are not located outside the domain of conventional operation. If a fault is detected, it can be useful to stop the fuel cell to prevent any dangerous malfunctioning.

A device according to the invention therefore responds well to the required demands of simplicity and reliability. Specifically, the bus 15 serves both for communicating data and for powering the modules, thereby enabling the measurements to be continued even in the event of malfunctioning of the fuel cell.

The invention claimed is:

1. A measurement device for measuring voltages of cells in a fuel cell that includes N electrochemical cells separated by bipolar plates, with N being a natural number, the device comprising:
a plurality of voltage measurement modules, each module being capable of measuring M voltages on a group of adjoining cells of the fuel cell, with M being a natural number, and with M≤N/2, wherein a group of cells measured by a first module is adjacent to a group of cells measured by a second module; and
a wired communication bus connecting in series the modules to an electronic computer, wherein each module includes:
a mechanical connector for fixing the module onto the fuel cell,
an electronic voltage measurement device,
an electrical connector for connecting bipolar plates of the module to the electronic voltage measurement device, and
a connector for connecting the electronic voltage measurement device to the communication bus, and
wherein each module is shaped to cooperate with an adjacent module in such a way that a last bipolar plate connected to the first module also is connected to the second module.

2. The measurement device according to claim 1, wherein each electronic voltage measurement device measures voltages of two adjacent cells.

3. The measurement device according to claim 1, wherein the electrical connector includes a connecting portion capable of serving as a mechanical connector.

4. The measurement device according to claim 2, wherein the electrical connector includes a connecting portion capable of serving as a mechanical connector.

5. The measurement device according to claim 3, wherein the electrical connector is structured to cooperate with metal lugs arranged on the bipolar plates.

6. The measurement device according to claim 4, wherein the electrical connector is structured to cooperate with metal lugs arranged on the bipolar plates.

7. The measurement device according to claim 1, further comprising a galvanic isolation device arranged between the communication bus and the fuel cell.

8. The measurement device according to claim 7, wherein the galvanic isolation device includes an optocoupler.

9. The measurement device according to claim 1, wherein each module includes an address that is different from another module.

10. The measurement device according to claim 1, wherein M=8.

* * * * *